United States Patent [19]

Hanna

[11] Patent Number: 4,540,957
[45] Date of Patent: Sep. 10, 1985

[54] AMPLITUDE MODULATOR FORMS TWO PHASE-SHIFTED PULSE TRAINS AND COMBINES THEM

[75] Inventor: George D. Hanna, Dallas, Tex.

[73] Assignee: Continental Electronics Mfg. Co., Dallas, Tex.

[21] Appl. No.: 492,305

[22] Filed: May 6, 1983

[51] Int. Cl.³ .................. H03K 7/08; H03C 1/50; H03C 1/01
[52] U.S. Cl. ........................... 332/10; 332/17; 332/31 R; 332/41; 332/48; 375/41; 455/108
[58] Field of Search ............. 332/9 R, 10, 31 R, 41, 332/48, 17; 375/41, 42, 43; 455/108, 109

[56] References Cited

U.S. PATENT DOCUMENTS

| | | | |
|---|---|---|---|
| 3,316,503 | 5/1964 | Lenz | 332/16 |
| 3,480,881 | 11/1969 | Boykin | 332/9 R |
| 3,513,400 | 5/1970 | Russell | 328/147 |
| 3,551,851 | 12/1970 | Engle | 332/9 T |
| 3,955,155 | 5/1976 | Behrend | 332/41 X |
| 3,956,715 | 5/1976 | Behrend | 332/41 X |
| 3,995,178 | 11/1976 | Gilbert | 332/9 T X |
| 4,015,213 | 3/1977 | Hamada | 332/9 R X |
| 4,272,737 | 6/1981 | Molyneux-Berry | 332/1 |
| 4,335,363 | 1/1982 | Bowers | 332/37 |
| 4,346,354 | 8/1982 | Hanna | 332/43 |

FOREIGN PATENT DOCUMENTS 2524522 12/1976 Fed. Rep. of Germany ..... 332/9 R
0075163 6/1977 Japan .......................... 332/31 R Primary Examiner—Eugene R. LaRoche
Assistant Examiner—D. C. Mis
Attorney, Agent, or Firm—Nolte, Nolte and Hunter

[57] ABSTRACT

A system and method for amplitude modulating a carrier signal with an audio or other information input signal relies on multivibrators and comparators initiating a logic controlled processing technique for providing two sinusoids, each a fundamental frequency waveform, the two having a mutual phase relationship defined by intermediate processing steps such that they differ in phase from 0 to 180 electrical degrees. The comparators output first resultant pulses when the carrier signal is greater than the amplitude of the audio or other information input signal. The first resultant pulses are input to a logic processing network to trigger multivibrators which output overlapping 180° wide pulses, respective phase shifted resultant signal waveforms being formed from the respective comparator outputs. In the output stage, the respective resultant waveforms are amplified and filtered to form the two sinusoids which are added vectorially to form an amplitude modulated output signal which varies linearly with the audio or information input signal.

9 Claims, 8 Drawing Figures

AMPLITUDE MODULATOR FORMS TWO PHASE-SHIFTED PULSE TRAINS AND COMBINES THEM

BACKGROUND OF THE INVENTION

The present invention relates to a system relying on logic means implementing phase-shift modulation techniques useful in radio frequency transmission, and, more specifically to an arrangement of comparators, timing and logic means defining in cooperative assocation each with another or others Boolean logic directed processing of a modulating information bearing signal to be impressed on a carrier or fundamental frequency wave.

Various circuits are known and suggested to be employed in the transmission of an information bearing signal input to a system at a given relatively high frequency to be impressed upon or combined in some manner with a second relatively low frequency signal defining in combination an output of the system suitable for transmission. Techniques of the sort characterized are known variously as pulse width, amplitude, or, as in this instance, phase-shaft modulation techniques. Exemplary is the production of a pulse width modulated signal by varying the duration of the output voltage pulses of the two signals that are applied to an inverter circuit. Silicon controlled rectifiers are ideally suited to this mode of transmission and are employed to facilitate triggering action defining an on condition during a time interval equal to a half cycle of the voltage wave. An exemplary amplitude modulation circuit is described in U.S. Pat. No. 4,319,204 assigned to the assignee hereof. Therein disclosed is an exciter used with a pair of amplifier circuits having a common output circuit producing the desired amplitude modulating output signal. The exciter is employed to control the relative phases of the control signals fed to a pair of amplifier circuits. Generally, the result of employing any such exciter system is production of two square-wave signals having a mutual phase relationship based upon a varying level input, such as an audio signal.

Disclosed in U.S. Pat. No. 4,346,354 likewise assigned to the assignee hereof, is a system for producing two rectangular wave signals whose pulse widths are based on an amplitude varying signal fed to the system wherein the two rectangular pulses can be combined and processed to reproduce the original amplitude varying signal. In accordance with an embodiment, an arrangement of switches are used to generate the pulses and are on only for the length of time necessary to produce the required pulse width and are off for the remainder of the time. Pulse width in radians of the rectangular pulses varies linearly so that the fundamental wave peaks vary as a sine function. The invention therein described shows that if pulses having a width of $\eta$ in radians are centered about 0 and $\pi$, the amplitude of the fundamental wave will be given by the curve generated by an acrsine function generator. The pulses are generated a great number of times for each small change in the curve causing the peaks of the fundamental wave to form an envelope which matches the amplitude of the normalized arcsine signal at all points between 0 and 1 (normalized).

SUMMARY OF THE INVENTION

In accordance with an aspect of the invention there is provided a system for impressing a varying level signal on a carrier signal. The system includes a component for producing pulses when the carrier signal amplitude is greater than the amplitude of the varying level signal. An appropriate means for performing this function and incorporated in a preferred embodiment, is a variable threshold comparator having the varying level signal fed to the threshold setting inputs and sine wave signals at the carrier frequency fed to the remaining inputs. Timing means are provided for enabling formation of the pulses at predetermined times during a cycle of operation of the system and include an arrangement of components functioning in cooperative association to phase shift by 90° a derivative of a signal input at the carrier frequency while triggering an arrangement of multivibrator circuits providing additional control inputs. The various timing signals are, in the sense of the processing steps of the present invention useful in defining a control function enabling formation of inputs to a first logic stage. Logic stage processing of derivative signal waveforms is commenced responsive to inputing of the timed outputs of the comparators and can be conceptualized as functionally determined by a first intermediate output of the system, or, alternatively, a first resultant. The first resultant, then, is the signal and its complement jointly providing a means for defining, at least in part, the method by which a signal is to be impressed on the fundamental waveform. The processing is by stages; the first including, in the preferred embodiment, an OR gate and an AND gate dependent each upon the proper phasing of inputs by the timing circuits previously described. Outputs of the first logic stage are fed to a second logic stage, including a NAND and a NOR circuit both providing outputs to be fed, each to a respective input of a first and a second multivibrator circuit incorporated in the output stage of the system. Signals input to a respective multivibrator circuit may be considered, here again, as in the first instance, an intermediate output or resultant waveform; having been derived by the logic processing, that is, a first and second stage thereof. Summarizing: a first resultant or intermediate output may be visualized as the result of input stage processing, while a second resultant, or intermediate output is derived as a result of the logic stage processing. Outputs of the multivibrators in the output stage are amplified in power amplifiers associated each with a respective multivibrator. Filtering out the fundamental frequency of the produced signals by means of a pair of 90° filters defines a final resultant output in the form of two out-of-phase sinusoids, directed along two distinct output paths to a load, in this instance, an antenna. The voltage across the load is determined by the amount of overlapping of the two output signals which is a linear function of the amplitude of the modulating signal.

By use of the present invention, information, i.e., a varying signal representing information, can be impressed upon the fundamental frequency wave. In the case of a voltage signal, it can be used as an amplitude modulation method to transmit information, provided, that the time variation of the information is less than the time variation of the fundamental frequency of the carrier wave. This, of course, is a limitation present in almost all modulation systems.

An implementation consonant with the principles of the present invention when compared with earlier implementations, as for example that described in U.S. Pat. No. 4,346,354, obviates the necessity for pulse-width modulation.

Accordingly, it is an object of the present invention to provide an information processing method and circuit for producing two rectangular wave signals responsive to amplitude variations in a signal input to the circuit, the two signals having a mutual phase relationship determinative of the information content of the input signal, wherein the control signal derivation response of the circuit is determined according as the degree of overlap of the two rectangular wave signals.

Another object of the present invention is to provide a system for impressing information onto a fundamental frequency wave employing phase-shift modulation techniques for determining the overall response of the circuit, the input to which is that of the preceding object, the output of which is the vector sum of two overlapping signal waveforms determined in accordance with the mutual phase relationship of the rectangular wave signals these last defining an intermediate step in the processing in a system implemented in accordance with the preceding object.

Still another object of the present invention entirely consistent with either of the aforestated objects is to provide a circuit having input ports for receiving an information bearing signal waveform and a carrier signal waveform, combining the two by means of various intermediate processing steps, and determining an output as a function of and in accordance with rules concerning interrelations amoung the results of the intermediate steps.

The manner in which these and other objects are accomplished by the present invention will become clear from the following detailed description.

DETAILED DESCRIPTION OF THE INVENTION

Figure 1:
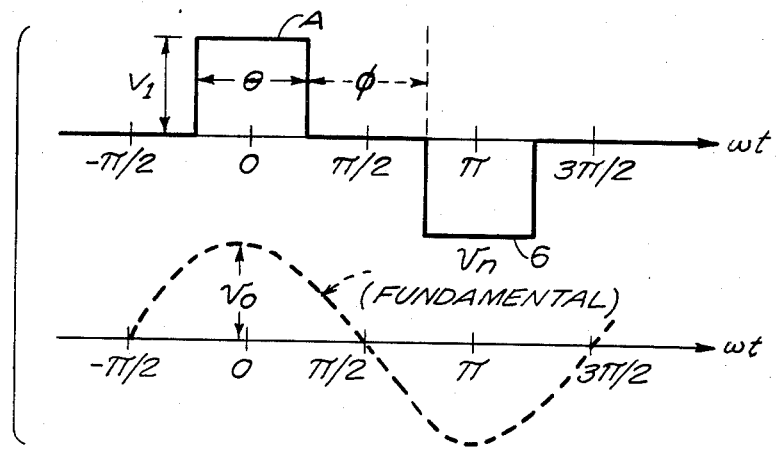
FIG. 1 is two waveforms, the first showing bipolar square wave pulses with the second being a fundamental sine wave.
Figure 2:
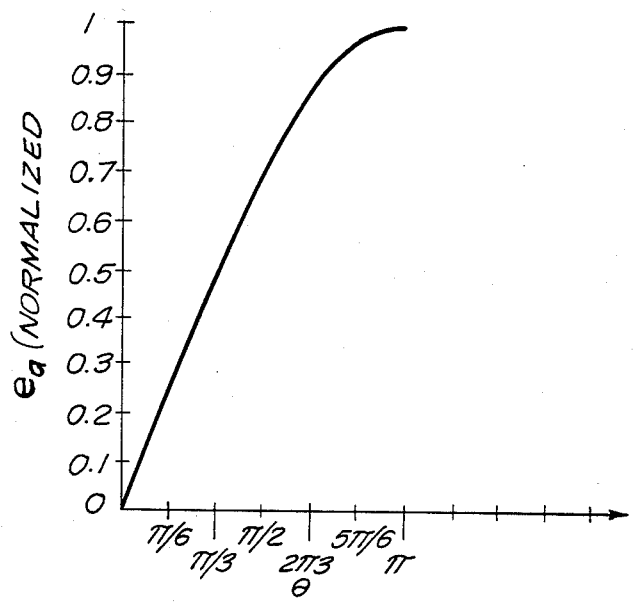
FIG. 2 is a plot of a normalized variable function versus square wave pulse width.
Figure 3:
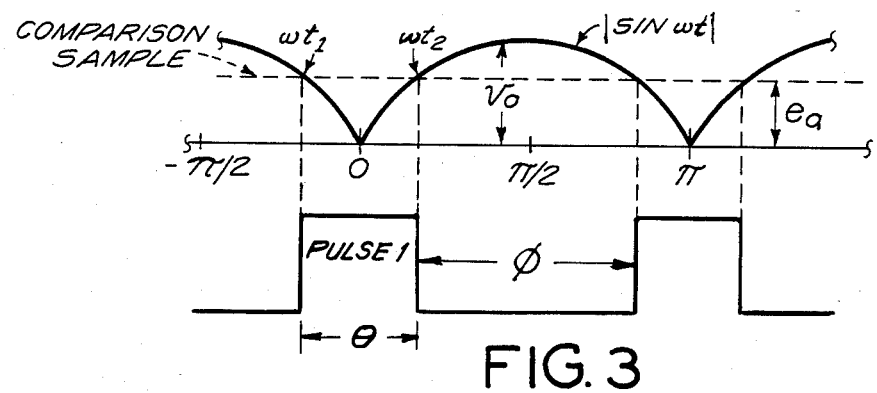
FIG. 3 is two waveforms, the first showing an absolute value sine wave and a comparison sample with the second being a pulse output signal produced by the embodiment of FIG. 4.

Refer to FIGS. 1 through 3; identical to those of U.S. Pat. No. 4,346,354. To the extent useful, the teachings of the same are incorporated by reference herein. In the drawing figures, and more specifically, FIG. 1, there is shown, generally, rectangular pulses extracted by circuit means during the course of impressing information on a carrier wave. More specifically, there are shown pulses 4 and 6 of bipolar amplitude in the uppermost portion of FIG. 1. Referring now to the lower waveform of FIG. 1, $V_N$ is the fundamental wave being a mathematical derivation demonstrated by the various expressions presented passium column 3 of the above referenced patent. Suggested throughout, and with particular reference now to FIG. 2, there exists, given an appropriate circuit analog, means for simulating a mathematical function having a relation, or stated another way, whose waveform should be useful in defining points at which, or about which, a series of rectangular pulses are to be generated, useful in control of a modulating process. In the particular instance dislcosed in relation to the drawings, FIGS. 1 through 3, and FIG. 2 more specifically, pulses are generated a large number of times, for each small change in $e_a$ where $e_a$, as will be recalled and as is apparent from the drawing FIGS. 1-3, an argument in a theoretical arcsine generator. In the general case it may be said that if the absolute value of the arcsine function, sin $\omega t$, is compared to any other function sample of amplitude $e_a$ where $0 < e_a < V_o$ (max), then a pulse can be generated at two points, $\omega t_1$, and $t_2$. Referring then to the preceding analysis, the time period existing between $\omega t_2 - \omega t_1$, is $\theta$, which occurs when the amplitude of $V_o$ does not exceed the amplitude of the curve $e_a$.

In the teachings of U.S. Pat. No. 4,346,354 and, more specifically, in relation to FIG. 3 thereof, it was shown that a plot of absolute values of the sine $\omega t$ function would have points falling below the comparison sample, i.e., below the level of the varying signal $e_a$, which points would be below the level of the varying signal, $e_a$, and that such points would be symmetrical about 0 and $\pi$. Accordingly, as shown therein, the lower trace of FIG. 3 was representative of unipolar pulses, which were centered about 0 and $\pi$. The specific technique therein taught involved inverting even numbered pulses, so that the resultant waveform was made up of symmetrically centered, rectangular bipolar pulses, the harmonic content of which was represented by the angle of the rectangular pulse. From an examination of the lowermost waveform of FIG. 3, and consonant with the technical exposition of the cited U.S. Patent, it was seen that the amplitude of the fundamental wave in this bipolar pulse train was equal to $e_a$. Therefore, as $e_a$ was then varied from 0 to $V_o$ (max) the fundamental wave peak $V_a$ had been made to correspond to the sample $e_a$ magnitude.

From the foregoing brief discussion, and with reliance upon the expanded discussion of the referenced publication, in the event that an enhanced understanding of the specifics of that technique should be considered desirable, it is seen that fashioning a mathematical analog of components or elements of the system useful in modulating a carrier signal with an information bearing time varying signal is now well within the knowledge of one skilled in the art. The realizations of the present invention are predicated at least in part on this earlier discovery. It was further demonstrated therein that if the sample $e_a$ is less than the time variation rate of the absolute value of the sine $\omega t$ function, then the peak of the fundamental wave $V_a$ will form an envelope or surface tangent to the fundamental curve. This envelope is then a reproduction of $e_a$. Thus, techniques such as those described therein can be used to impress information upon the fundamental frequency wave. Specifically, as previously pointed out, and as equally applicable herein, in the case of voltage waves, these techniques can be used as an amplitude modulation method to transmit information of substantially any form. The only constraint being that the time variation of the information signal must be less than the fundamental frequency.

Figure 4:
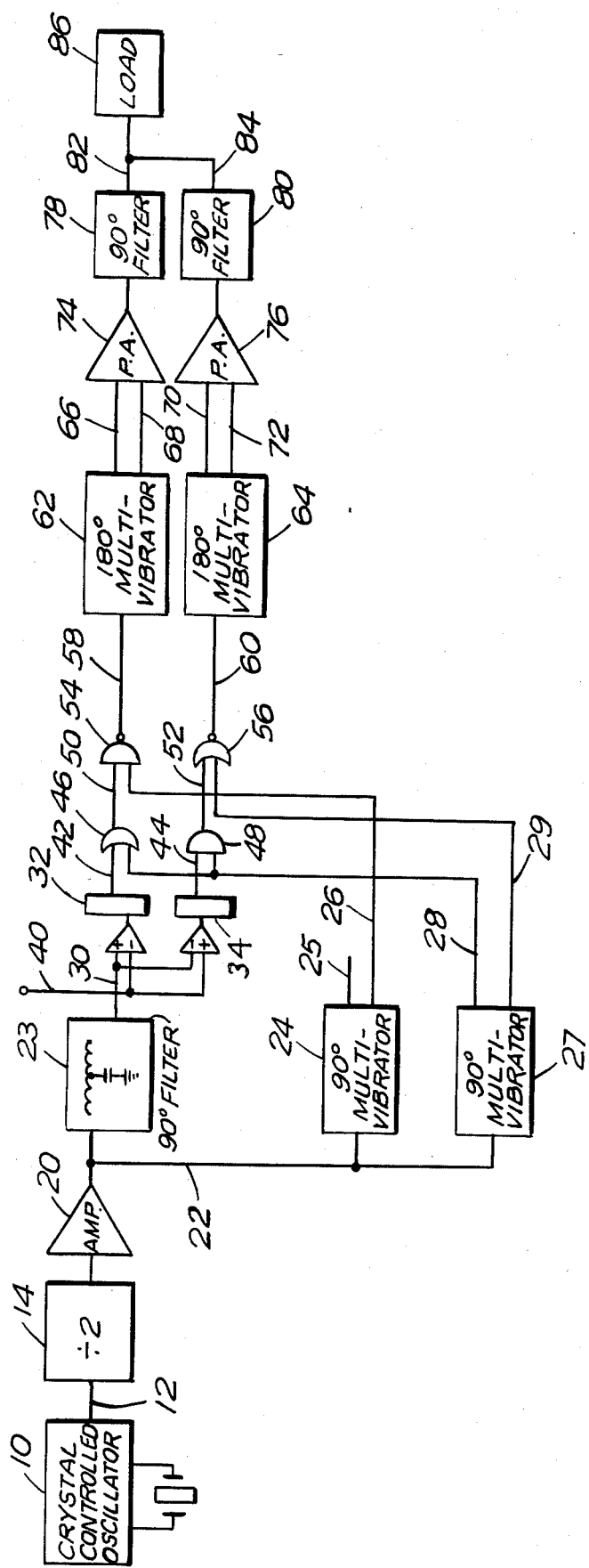
FIG. 4 is a circuit diagram in schematic form of a preferred embodiment of the present invention.

Referring then to FIG. 4, a circuit embodying the present invention is shown. Specifically, a crystal controlled signal generator 10 produces a signal on line 12 having a frequency of 2.08 MHz. The signal is fed to divide by two frequency splitter 14, to be amplified at 1.04 MHz in an amplifier 20, producing an amplified square-wave signal on line 22. This square-wave signal at carrier frequency can be generated by various methods, e.g., frequency synthesis, etc. The square-wave signal 22 is then fed to low pass filter 23; to positive edge triggered one shot multivibrator 24 which generates responsive to a signal on line 22, two signals of opposite polarity, a first on line 25, and a second, the complement of the first, on line 26; and to a similar, though negative edge triggered device or circuit 27, which generates, responsive to a signal on line 22, two signals, again, of opposite polarity, a first on line 28, and a second, the complement of the first on line 29. The output signal of low-pass filter 23, phase shifted 90° with respect to the square-wave signal input via line 22, is developed on line 30 and fed to the non-inverting input of high-speed comparator 32 and to the inverting input of high-speed comparator 34. The comparator units are biased in the conventional manner. The inverting input of the comparator 32 and the non-inverting input of the comparator 34 are connected to the same signal source via line 40. It is this signal source which represents the input information which is to be reproduced as the envelope of the 1.04 MHz carrier signal. In an experimental set up of this embodiment, the signal appearing on line 40 was varied between 0 and the amplitude of the positive edge peak of the carrier wave, or, equivalently, the phase-shifted output of low-pass filter 23 appearing on line 30. In such experimental set up, the comparators 32 and 34 were set to produce an output pulse during the time that the carrier wave amplitude was greater than the amplitude of the signal appearing on line 40. Because the triggering level signal on line 30 is fed to non-inverting and inverting inputs of high-speed comparators 32 and 34 respectfully, the pulses produced by the comparators will be of opposite polarity, that is, the one positive going and the other negative going, the former on line 42 and the latter on line 44. The signals on line 42 and 44 defined as a square-wave signal and its complement when the input signal 40 intersects the signal 30 at 0, $\pi$, 2 $\pi$, etc. are fed each to a respective logic gate 46 and 48 whereat there is performed, in the first instance the logical OR of the input signals of pulses 28 and 42 and in the second the logical AND of the signals, or pulses 28 and 44, the two logic gates, OR gate 46 and AND gate 48, perform the circuit function analogy of the Boolean algebra functions of the same means, notably, those of providing, in the first instance, a logic high output when either input is a logic high and in the second, a logic high output when both inputs are high.

In order to insure that two correctly phased input signals are provided to each of the logic circuits, i.e. OR gate 46 and AND gate 48, the present embodiment has been provided with an arrangement, of timing circuits previously described, notably, and in the instance of the inputs provided via lines 42 and 44, that of low-pass filter 23, and in the instance of the input provided via line 28 to both gates 46 and 48, that of 90° negative edge triggered multivibrator 27. Phase shifting operations of these timing circuits and those of comparison provided by comparators 32 and 34 permit proper phasing for operation of the logic circuits.

The output signals from the logic gates 46 and 48 on lines 50 and 52 respectively are fed each to a respective input of logic gates 54 and 56, whereat there is performed, in the first instance, the logical NAND of the square-wave input signals 26 and 50 and in the second the logical NOR of square-wave signals 29 and 52. The two logic gates, NAND gate 54 and NOR gate 56 perform the circuit function analogy of the Boolean algebra functions of the same names, notably, those of providing in the first instance, a logic high output when any input is absent, low or logical 0, and a logic low output if all of its inputs are high, and in the second a logic high output when all inputs are absent, low, or logical 0, according as the bias. The output signals from the logic gates 54 and 56 on lines 58 and 60, respectively, are fed, each to a respective input of multivibrators 62 and 64; whereat, in each instance there are generated square-wave output signals on line 66 and 70, and their respective complements on lines 68 and 72. The output signals from the multivibrators 62 and 64 on lines 66 and 68 in the first instance and on lines 70 and 72 in the second, are amplified in power amplifiers 74 and 76, the outputs of which are, in turn fed each to a respective 90° filter 78 in correspondence with power amplifier 74, and 80, in correspondence with power amplifier 76. The 90° filters 78 and 80 provide a mechanism for filtering out the fundamental frequency of the produced signals associated each with a distinct set of logic conditions previously described, in connection with a discussion of inputting of the modulating signal, i.e., on line 40 and the various comparing and gating operations provided by the circuit elements associated generally with the reference numerals 32, 34, 46, 48, 54 and 56, the sum of whose operation ultimately defines two distinct signals directed along the two signal paths or lines 58 and 60. Extraction of the fundamental frequency, in either instance, i.e., by means of the 90° filters 78 and 80 is equivalent to defining two out-of-phase sinusoids apparent as signals directed along the output lines 82 and 84 to a load 86, in this instance an antenna. Since the filters 78 and 80 are 90° networks, both of the outputs 82 and 84 can be hard wired to the load 86. The voltage across the load 86 is then determined by the amount of overlapping of the two output signals, which is a linear function of the amplitude of the modulating signal.

Figure 5:
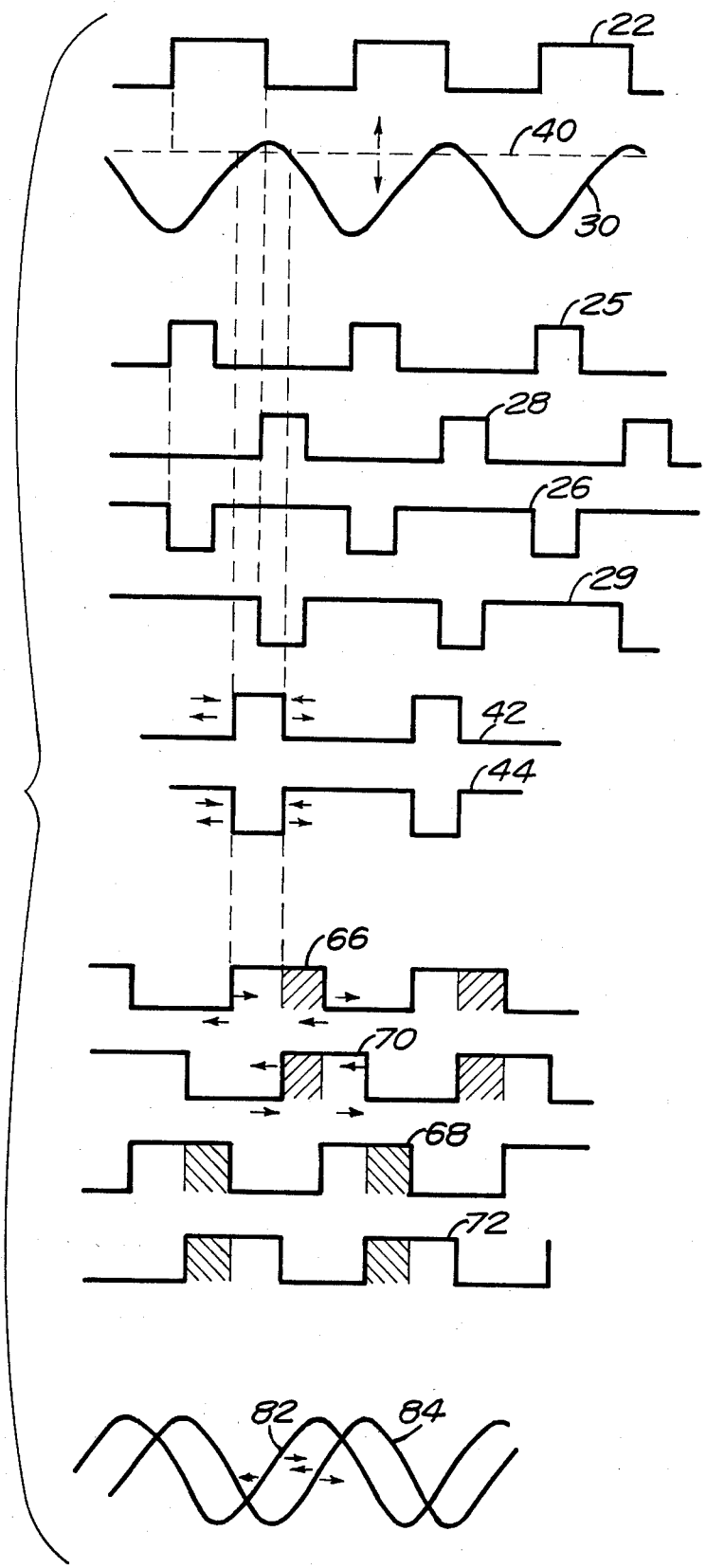
FIG. 5 is a series of waveforms obtained at specific locations in the circuit of FIG. 4.

In order to appreciate more fully the operation of the present invention, the waveforms of the various signals, at points throughout the circuit of FIG. 4 are shown in FIG. 5. The numerals in FIG. 5 indicate the signals appearing on the corresponding lines in the circuit of FIG. 4. Specifically, square-wave 22 in the uppermost waveform of FIG. 5 represents the signal appearing on line 22. The signal appearing on this line is then shaped and phase-shifted by low-pass filter 23 to produce a sinusoid represented by the waveform 30. This signal acts as a variable threshold signal and is fed to the non-inverting input of high-speed comparator 32 and to the inverting input of high-speed comparator 34, each of which has as its other input the variable signal appearing on line 40. While in FIG. 5, signal 40 appears to be a constant, nevertheless, it is pointed out that the rate of change of the information or audio input signal should be substantially less than the rate of change of the carrier signal. Thus, in FIG. 5 the signal on line 40 appears as a constant in relation to the much higher frequency carrier signals on line 30. The outputs of the comparators 32 and 34 on lines 42 and 44 represent output pulses which were produced during the time that the carrier signal amplitude on line 30 was greater than the varying information or audio signal on line 40. Such correlation can be seen from the waveforms of FIG. 5 by comparing the portion of waveform 30 about wave 40 and the location of the first signalpulse on line 42. The outputs of the two comparators 32 and 34 as well as an output of the multivibrators 27 developed on line 28, represented in FIG. 5 by waveform 28 are then fed to a respective logic gate, in the first instance, OR gate 46 and in the second AND gate 48 to produce, in the first instance, an output signal on line 50 and in the second an output signal on line 52, each of which outputs are provided as an input to a respective logic gate, in the first instance, NAND gate 54 is represented by the waveform 26 in FIG. 5, which, as will be seen with continuing reference to FIG. 4, is developed as an output of multivibrator 24. A second input to NOR gate 56 as represented by the waveform 29 is developed as an output of multivibrator 27.

OR gate 46 operates to produce an output pulse when either of its inputs is high. Thus, when either waveform 28 or waveform 42 is high, a pulse will be produced on line 50, which will serve as a logic high input to NAND gate 54 under these conditions. Additional logic high inputs to NAND gate 54 are developed on line 26 as second inputs to this circuit. In that NAND gate 54 produces a pulse either when both inputs are at logic low or when one or the other input is at logic low, it may be seen readily that an output pulse is developed on line 58 only in the event that neither logic high output condition is satisfied for OR gate 46. With this understanding of the interrelation of the outputs of OR gates 46 and NAND gate 54, it becomes equally apparent that control functions provided by inclusion of NAND gate 54 may be appreciated with reference to waveform 26. Control functions provided by inclusion of NOR gate 56 may be appreciated readily with reference to waveform 29 upon a recognition that a pulse is developed on line 60 in the event that line 29 and line 52 are both at a logic low. Waveforms 66 and 68 are representative of the outputs of one shot multivibrator 62, occurring at the high-to-low transition of NAND gate 54. Waveforms 70 and 72 are representative of the outputs of one shot multivibrator 64, occurring at the high-to-low transition of NOR gate 56. These pulses then are amplified in respective power amplifiers 74 and 76, the outputs of which then are fed to a respective 90° filter 78 and 80. Waveform 82 is representative of the fundamental frequency, comprising the filtered output of filter 78, whereas waveform 84 demonstrates operation of filter 80, notably filtering of the fundamental frequency and developing an output differing in phase from 0° to 180° with respect to the filter output of filter 78.

The voltage across the load 86, in this instance, an antenna, is then determined by the amount of overlapping of the two signals whose representative filter output waveforms are indicated by the reference numerals 82 and 84 of FIG. 5. Determination of an information bearing output in this manner has been referred to as vector summation, which is a linear function of the amplitude of the modulating signal. Since the filters 78 and 80 are 90° networks, both outputs 82 and 84 can be hard wired to the load 86. In that the filters form a combiner, power amplifiers 74 and 76 will be open circuited in the event that the load is short circuited. The combiner serves to unload the power amplifiers in a well known manner.

Figure 6A:
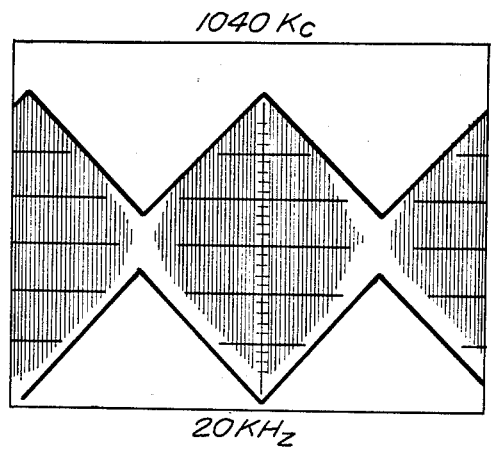
FIGS. 6(a), 6(b) and 6(c) are representations of actual photographic samples of waveforms present during the operation of the embodiment of FIG. 4.
Figure 6B:
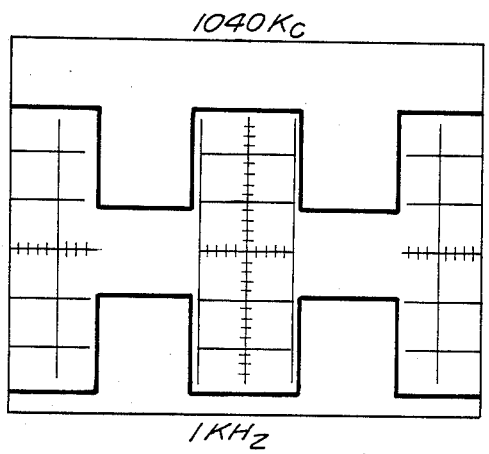
Figure 6C:
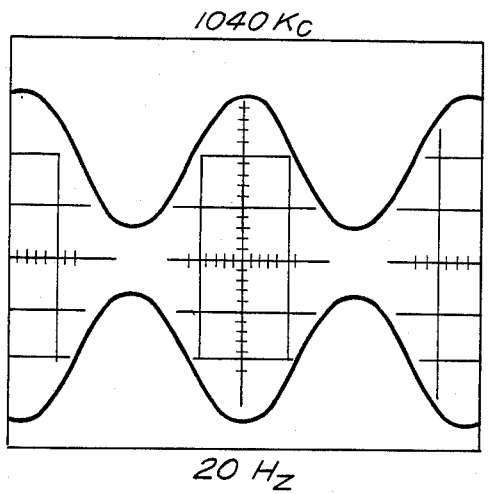

As a demonstration of an application environment in which the principles of operation of an embodiment of the present invention may be appreciated more readily, photographs of actual output signal envelopes with various audio input signals are shown in FIG. 6(a) to 6(c). All photos were taken using a carrier of 1.04 MHz (1040 KHz) in the drawing figure. FIG. 6(a) shows the signal developed as a linear function of the amplitude of the modulating signal and derived through operation of the combiner formed by the power amplifiers 74 and 76 of FIG. 4. This output envelope was produced by a triangular waveform audio input signal of 20 KHz being input on line 40. FIG. 6(b) shows the result, obtained in like fashion, where the input signal was a square-wave input signal on line 40 of frequency 1 KHz with a carrier of 1040 KHz. FIG. 6(c) shows the sinusoidal envelope of the signal obtained in like fashion where the output envelope was produced with a carrier frequency of 1040 KHz at a sinusoidal audio input signal of 20 Hz on line 40.

It is understood that the foregoing is presented by way of example only and is not intended to limit the scope of the present invention, accept as set forth in the appended claims.

What is claimed is:

1. A system for producing an amplitude modulated sinusoidal signal of carrier frequency whose voltage amplitude varies linearly with variations in the voltage level of a varying voltage level modulating signal, comprising:
    (a) first signal generating means for generating a rectangular wave voltage signal having said carrier frequency;
    (b) first filter means connected to said first signal generating means for extracting the fundamental signal component from said rectangular wave voltage signal, whereby the output of said first filter means is a sinusoidal wave voltage signal having said carrier frequency;
    (c) comparator means connected to receive said filter means output and said modulating signal for continuously comparing their respective instantaneous voltage levels and, whenever a condition exists that the instantaneous voltage level of said filter means output exceeds that of said modulating signal, producing a unipolar rectangular pulse and its complement, each of duration equal to the duration of said condition, whereby said comparator means outputs first and second trains of unipolar rectangular pulses with the second train being the complement of the first and with the widths of the pulses in each train being variable in dependence upon the instantaneous voltage level relationship of said filter means output with said modulating signal;
    (d) first multivibrator means coupled to said comparator means and responsive to said first train of variable width unipolar rectangular pulses for forming a first train of constant width unipolar rectangular pulses and its complement, each constant width pulse thereof starting with the start of a respective first train variable width pulse and ending 180° later therefrom;
    (e) second multivibrator means coupled to said comparator means and responsive to said second train of variable width unipolar rectangular pulses for forming a second train of constant width unipolar rectangular pulses and its complement, each constant width pulse thereof starting with the end of a respective second train variable width pulse and ending 180° later therefrom, the respective 180° wide pulses of the first and second trains overlapping to define a first of two resultant signal waveforms, while those of the complements of said first and second trains overlap to define the second resultant signal waveform;

(f) second filter means for extracting the fundamental signal component from each of said resultant signal waveforms thereby to provide respective sinusoidal wave voltage signal outputs having said carrier frequency; and (g) means for adding vectorially said outputs of said second filter means whereby, as the varying voltage level modulating signal is varied from a voltage amplitude of 0 of the sinusoidal wave voltage signal of carrier frequency outputted by said first filter means to the peak voltage amplitude of said carrier frequency voltage signal, said amplitude modulated sinusoidal signal of carrier frequency will be formed whose voltage amplitude varies linearly with variations in the voltage level of said modulating signal.

2. The system of claim 1, wherein said comparator means comprises a pair of variable threshold comparators having the modulating signal fed to the threshold setting inputs thereof, and the output of said first filter means fed to the remaining inputs thereof.

3. The system of claim 2, wherein the coupling of said first and second multivibrator means to said comparator means is by way of logic means comprising an arrangement of gates including an OR gate and a NAND gate dedicated to said first train of variable width unipolar rectangular pulses and an AND gate and a NOR gate dedicated to said second train of variable width unipolar rectangular pulses.

4. The system of claim 3, wherein said arrangement of gates is controlled in response to 90 carrier degrees wide unipolar pulses respectively triggered by the leading and trailing edges of said rectangular wave voltage signal having said carrier frequency.

5. The system of claim 1, wherein said first filter means is a 90° phase shift low pass filter.

6. The system of claim 4, further comprising an arrangement of multivibrator means operatively associated with said first signal generating means and said logic means for supplying said 90 carrier degrees wide unipolar pulses to said gate arrangement.

7. The system of claim 1, wherein said overlappings of said respective 180° wide pulses of said first and second trains of constant width unipolar rectangular pulses and of their complement trains define overlapping pulse portions which are centered respectively about $\pi$ and $2\pi$ radians of said sinusoidal wave voltage signal having said carrier frequency, as outputted by said first filter means.

8. A system for impressing a modulating information signal of varying voltage amplitude upon a carrier frequency signal, comprising:

means for producing a bipolar signal having the carrier frequency, each half-cycle of said bipolar signal being 180° electrical degrees wide and of unvarying voltage amplitude;

filter means for extracting from said bipolar signal the sinusoidal waveshape fundamental signal component thereof having said carrier frequency, each half-cycle of said fundamental signal component being 180 electrical degrees wide and of a constant peak voltage amplitude;

voltage amplitude comparison means responsive to inputs of said modulating signal and said fundamental signal component for generating complementary trains of unipolar rectangular pulses, the leading and trailing edges of each pulse and its complement respectively occurring an equal number of electrical degrees before and after the electrical angle at which each half-cycle of said fundamental signal component reaches its peak voltage amplitude, the width of said unipolar pulses in electrical degrees being variable and each having a width corresponding to the length of time in a positive half-cycle of said fundamental signal component that the voltage amplitude of said information signal is exceeded by instantaneous voltage amplitude values of said fundamental signal component;

first triggerable pulse generating means coupled to the output of said comparison means for being triggered thereby to generate a first train of unipolar rectangular pulses 180 electrical degrees wide at the carrier frequency, each 180° wide pulse of said first train starting simultaneously with the starting of a respective variable width unipolar rectangular pulse generated by said voltage amplitude comparison means;

second triggerable pulse generating means coupled to the output of said comparison means for being triggered thereby to generate a second train of unipolar rectangular pulses 180 electrical degrees wide at the carrier frequency, each 180° wide pulse of said second train starting simultaneously with the ending of a respective variable width unipolar rectangular pulse generated by said voltage amplitude comparison means, whereby said first and second trains of 180° wide unipolar rectangular pulses are generated with a phase difference therebetween which varies linearly with the pulse widths of the variable width unipolar rectangular pulses generated by said voltage amplitude comparison means;

first circuit means connected at its input to the output of said first triggerable means for extracting from said first train of 180° wide rectangular pulses the sinusoidal waveshape fundamental signal component thereof;

second circuit means connected at its input to the output of said second triggerable means for extracting from said second train of 180° wide rectangular pulses the sinusoidal waveshape fundamental signal component thereof, the fundamental signal components extracted respectively by said first and second circuit means having the same variable phase difference therebetween as have said first and second trains of 180° wide rectangular pulses; and means for combining the two fundamental signal components to form an amplitude modulated carrier frequency voltage whose modulation, determined by the phase difference of said fundamental signal components, is a linear function of the varying voltage amplitude of said modulating information signal.

9. A time and event directed logical processing method for impressing an information signal on a carrier signal, comprising the steps of:

producing unipolar pulses and their complements with durations coincident with time intervals during which the instantaneous amplitude of a sinusoidal carrier frequency signal is greater than the information signal amplitude;

timing logical processing of said pulses and their complements in relation to events defined in relation to alternations at the carrier frequency;

forming in continuous response to the logically processed pulses and their complements, respective pairs of trains of overlapping 180° wide pulses, one train pair defining the first of two resultant signal waveforms and the other train pair defining the second of two resultant signal waveforms;

extracting the fundamental signal component from each of said resultant signal waveforms to provide respective variably phase-displaced sinusoidal waveforms of said carrier frequency; and, vectorially adding the waveforms resulting from said extracting step, whereby as the level of the information signal is varied from 0 to the maximum of the sinusoidal carrier frequency signal, an amplitude modulated carrier frequency wave is formed whose envelope linearly conforms with the varying level of said information signal.

* * * * *